(12) United States Patent
Bonthron et al.

(10) Patent No.: US 8,367,469 B2
(45) Date of Patent: Feb. 5, 2013

(54) CHIP-SCALE SEMICONDUCTOR DIE PACKAGING METHOD

(75) Inventors: Andrew J. Bonthron, Los Angeles, CA (US); Darren Jay Walworth, Fullerton, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/347,543

(22) Filed: Jan. 10, 2012

(65) Prior Publication Data

US 2012/0115279 A1 May 10, 2012

Related U.S. Application Data

(63) Continuation of application No. 12/635,677, filed on Dec. 10, 2009, now Pat. No. 8,093,714.

(51) Int. Cl.
*H01L 21/00* (2006.01)
(52) U.S. Cl. ........ 438/107; 438/108; 438/122; 257/713; 257/724; 257/704; 257/E23.101; 257/E23.19; 257/E21.5; 257/E21.511
(58) Field of Classification Search ................. 438/107, 438/108, 122; 257/713, 724, 704, E23.101, 257/E23.19, E21.5, E21.511
See application file for complete search history.

(56) References Cited

U.S. PATENT DOCUMENTS

| | | | |
|---|---|---|---|
| 5,900,675 A | 5/1999 | Appelt et al. | |
| 5,940,271 A * | 8/1999 | Mertol | 361/704 |
| 7,271,028 B1 | 9/2007 | Pace | |
| 2002/0036541 A1 | 3/2002 | Buer | |
| 2002/0043658 A1 | 4/2002 | Mess et al. | |
| 2004/0036154 A1* | 2/2004 | Ho et al. | 257/678 |
| 2007/0045824 A1 | 3/2007 | Zhao et al. | |
| 2007/0117270 A1 | 5/2007 | Renavikar et al. | |
| 2008/0179758 A1 | 7/2008 | Wong et al. | |
| 2008/0258278 A1 | 10/2008 | Ramos et al. | |
| 2009/0115048 A1 | 5/2009 | Zhao et al. | |

* cited by examiner

*Primary Examiner* — Tu-Tu Ho
(74) *Attorney, Agent, or Firm* — McDermott Will & Emery LLP

(57) ABSTRACT

A method of packaging one or more semiconductor dies is provided. The method includes: providing a first die having a circuit surface and a connecting surface; providing a chip-scale frame having an inside surface and an outside surface, the chip-scale frame having a well region having an opening in the inside surface; coupling the first die to a wall of the well region using a first coupling mechanism for electrical and mechanical coupling; providing a substrate having a top surface and a bottom surface; coupling the inside surface of the chip-scale frame with the top surface of the substrate by a second coupling mechanism, wherein a gap is provided between the circuit surface of the first die and the top surface of the substrate; coupling a heat sink to the outside surface of the chip-scale frame using a third coupling mechanism.

14 Claims, 7 Drawing Sheets

CHIP-SCALE SEMICONDUCTOR DIE PACKAGING METHOD

CROSS REFERENCE TO RELATED APPLICATIONS

This is a continuation application of U.S. patent application Ser. No. 12/635,677 entitled "CHIP ASSEMBLY WITH CHIP-SCALE PACKAGING," filed on Dec. 10, 2009, which is hereby incorporated by reference in its entirety for all purposes.

BACKGROUND

Recent advances in digital communications have led to increased performance demands on transceiver implementations. For a semiconductor transceiver, such increased performance demands may require, for example, higher clock speeds, better heat dissipation, higher density of external connectors, or concurrent use of chips using different semiconductor materials (e.g., silicon germanium, indium phosphide and gallium arsenide).

In one chip assembly technique used to meet the increased performance requirements, a silicon germanium (SiGe) die is bonded to a substrate by the circuit side surface of the die. A heat sink is attached to the opposite side for heat dissipation. Because the die is "flipped" from its conventional "circuit-side up" position, this technique is sometimes called a "flip-chip" configuration.

One operational problem faced by a flip-chip configuration is that when the flip-chip is placed in the same chip assembly with another die that is not in a flip-chip configuration, the two dies generally cannot share a common heat sink. Because one chip is in a "straight up" configuration while the other is in a flip-chip configuration, their heat is dissipated in different directions, thereby making it harder to dissipate the heat by the same heat sink. Such a problem may arise, for example, in a multi-mode chip assembly, wherein the flip-chip may be a silicon germanium die and the "straight up" die may be an indium phosphide or gallium arsenide die that is typically not flipped due to brittleness.

In certain aspects of the disclosure, a better chip assembly is needed to meet the increased performance requirements.

SUMMARY

In an aspect of the disclosure, a chip assembly may comprise a substrate having a top surface and a bottom surface. The chip assembly may comprise a first die having a circuit surface and a connecting surface, the circuit surface comprising one or more integrated circuits. The chip assembly may comprise a chip-scale frame having an inside surface, an outside surface, and a well region, the well region having an opening within the inside surface, the well region having a wall, the well region housing the first die, the first die attached to the wall by a first coupling mechanism, the inside surface coupled to the top surface of the substrate by a second coupling mechanism. The chip assembly may comprise a heat sink coupled to the outside surface of the chip-scale frame using a third coupling mechanism.

In another aspect of the disclosure, a method of packaging one or more semiconductor dies may comprise one or more of the following: providing a first die having a circuit surface and a connecting surface, providing a chip-scale frame having an inside surface and an outside surface, the chip-scale frame having a well region having an opening in the inside surface, coupling the first die to a wall of the well region using a first coupling mechanism for electrical and mechanical coupling, providing a substrate having a top surface and a bottom surface, coupling the inside surface of the chip-scale frame with the top surface of the substrate by a second coupling mechanism, wherein a gap is provided between the circuit surface of the first die and the top surface of the substrate, and coupling a heat sink to the outside surface of the chip-scale frame using a third coupling mechanism.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
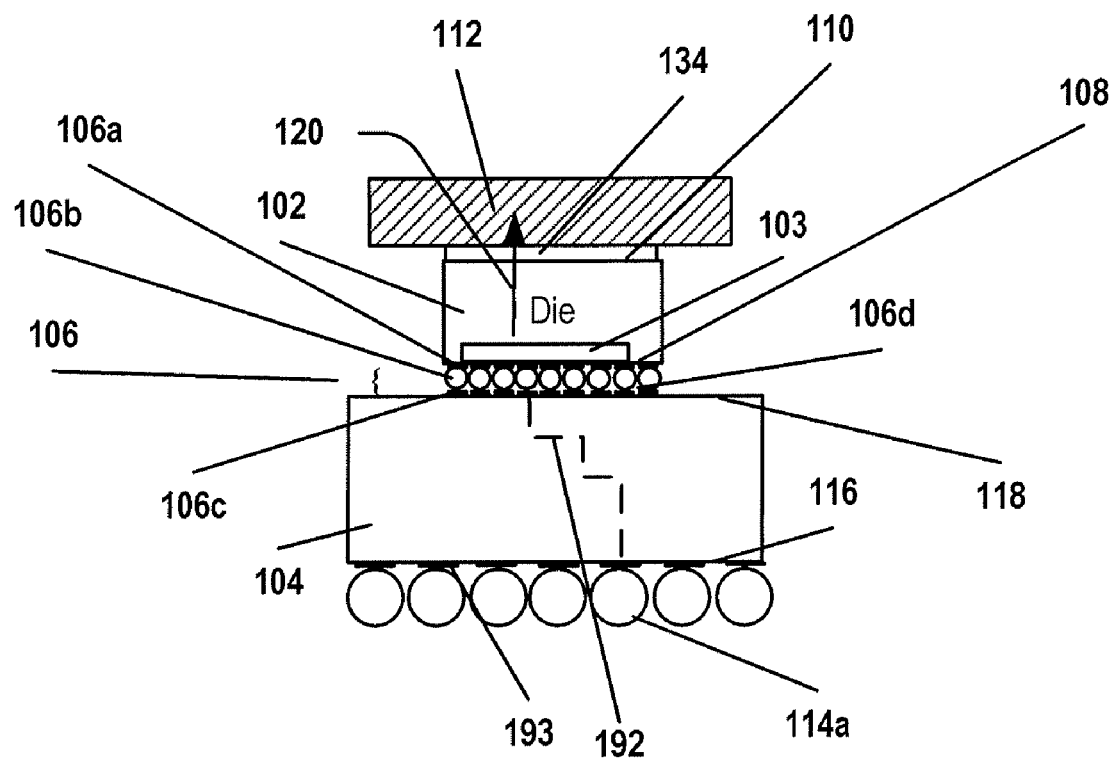
FIG. 1 is a block diagram depicting an example of a semiconductor die in a flip-chip configuration in accordance with certain configurations of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

Broadly and generally, in one aspect, the present disclosure provides a multi-chip package method to meet the increased performance requirements (e.g., higher clock speeds and integration of more functions in the same semiconductor package) due to the need to perform high-speed digital communication. For example, an OC-768 compliant optical transceiver may require transmission/reception of data traffic at 38,486.016 Mbit/s. A microelectronics implementation of such a transceiver may comprise silicon germanium (SiGe) for circuit integration and speed (e.g., data processing functions) and indium phosphide (InP) or gallium arsenide (GaAs) for high voltage swing and speed (e.g., output line driver). In one aspect, the present disclosure provides configurations for packaging such dies in a single chip assembly ("mixed-mode packaging"). In one aspect, the mixed-mode packaging may be configured to share a same heat sink.

Broadly and generally, in one aspect, the present disclosure provides a chip-scale package assembly wherein a die may be coupled to a first surface of a chip-scale frame in a well region and the chip-scale frame is coupled to a second substrate, thereby positioning the die in a space formed by the well region and the second substrate. In certain configurations, the chip-scale frame may be a well-understood, inexpensive substrate. This choice of the chip-scale frame may facilitate easy testing and yielding of the chip-scale package. In certain configurations, a lid may be positioned over the die to form a substantially airtight chamber (hermetically sealed) enclosing the die. In one aspect, such configurations may protect the die from exposure to gases emitted by adhesives (e.g., hydrogen emission by epoxy adhesive) used in the chip assembly. The hermitic sealing of the die may make it possible to use inexpensive adhesives for a chip assembly containing a chip-scale package.

Broadly and generally, in one aspect, the present disclosure provides a mixed-mode configuration, comprising a flip-chip die configuration and a chip-scale package, both positioned to use a common heat sink. In one aspect, the mixed-mode configuration may provide sufficient environmental isolation for the die in the chip-scale package to forego expensive multi-chip hermetic sealing.

Broadly and generally, in one aspect, chip-scale package configurations of the present disclosure may allow dense placement of external connectors, such as ball grid array connectors.

Broadly and generally, in one aspect, chip-scale package configurations of the present disclosure may lend themselves to a more predictable circuit behavior because unlike a flip-chip configuration in which the integrated circuits on a die are in close proximity to an underfill material with possibly unknown, not-well-controlled, or undesirable electrical characteristics, the integrated circuits on a die in a chip-scale package may be in contact with air or another non-reacting gas, having well-known, well-controlled, and desirable electrical characteristics and composition.

Unless otherwise mentioned, various configurations described in the present disclosure may be implemented on a silicon, silicon-germanium (SiGe), gallium arsenide (GaAs), indium phosphide (InP) or indium gallium phosphide (InGaP) or any other suitable semiconductor material.

FIG. 1 is a block diagram depicting a chip assembly 100 having a flip-chip package configuration in accordance with certain configurations of the present disclosure. A semiconductor die 102 may be coupled to a substrate 104 having a top surface 118 and a bottom surface 116, via a coupling mechanism 106. In the illustrated embodiment, the semiconductor die 102 has a circuit surface 108, where integrated circuits are located, and a connecting surface 110, for adhering the die 102 to another component. The coupling mechanism 106 may include, for example, (i) solder joints 106b for electrically coupling electrical contacts 106a of the die 102 to electrical contacts 106c of the substrate 104 and (ii) a material known as "underfill" 106d for filling the space between the solder joints 106b. The coupling mechanism 106 may bond the circuit surface 108 to the top surface 118 of the substrate 104. The connecting surface 110 of the die 102 may be coupled to a substantially planar heat sink 112, using, for example, an adhesive layer 134 comprising a well-known adhesive material such as epoxy. The adhesive material may include a heat transferring material to provide good heat dissipation from the die 102 through the heat sink 112.

Still referring to FIG. 1, in operation, the heat generated by the integrated circuits 103 located at surface 108 generally may travel upwards, in the direction of arrow 120, and may be dissipated by the heat sink 112. The bottom surface 116 may have electrical contacts 193 that are coupled to external connectors, such as ball grid array connectors 114a, to carry electrical signals to/from the die 102 via interconnects 192 in the substrate 104.

A flip-chip configuration, as illustrated in FIG. 1, may be useful for a die comprising a relatively sturdy material such as SiGe or another Si-based material; however, a flip-chip configuration is less desirable, due to durability concerns, for a relatively brittle material such as InP, GaAs, or another III-V semiconductor compound. A III-V semiconductor compound may include one or more materials from group III of the periodic table (e.g., B, Al, Ga, In, Ti) and one or more materials from group V of the periodic table (e.g., P, As, Sb, Bi). Furthermore, if a chip assembly includes a die in the flip-chip configuration and another die not in the flip-chip configuration, the two dies do not conduct heat in the same direction. Therefore, it may not be possible to use a common substantially planar heat sink.

Figure 2:
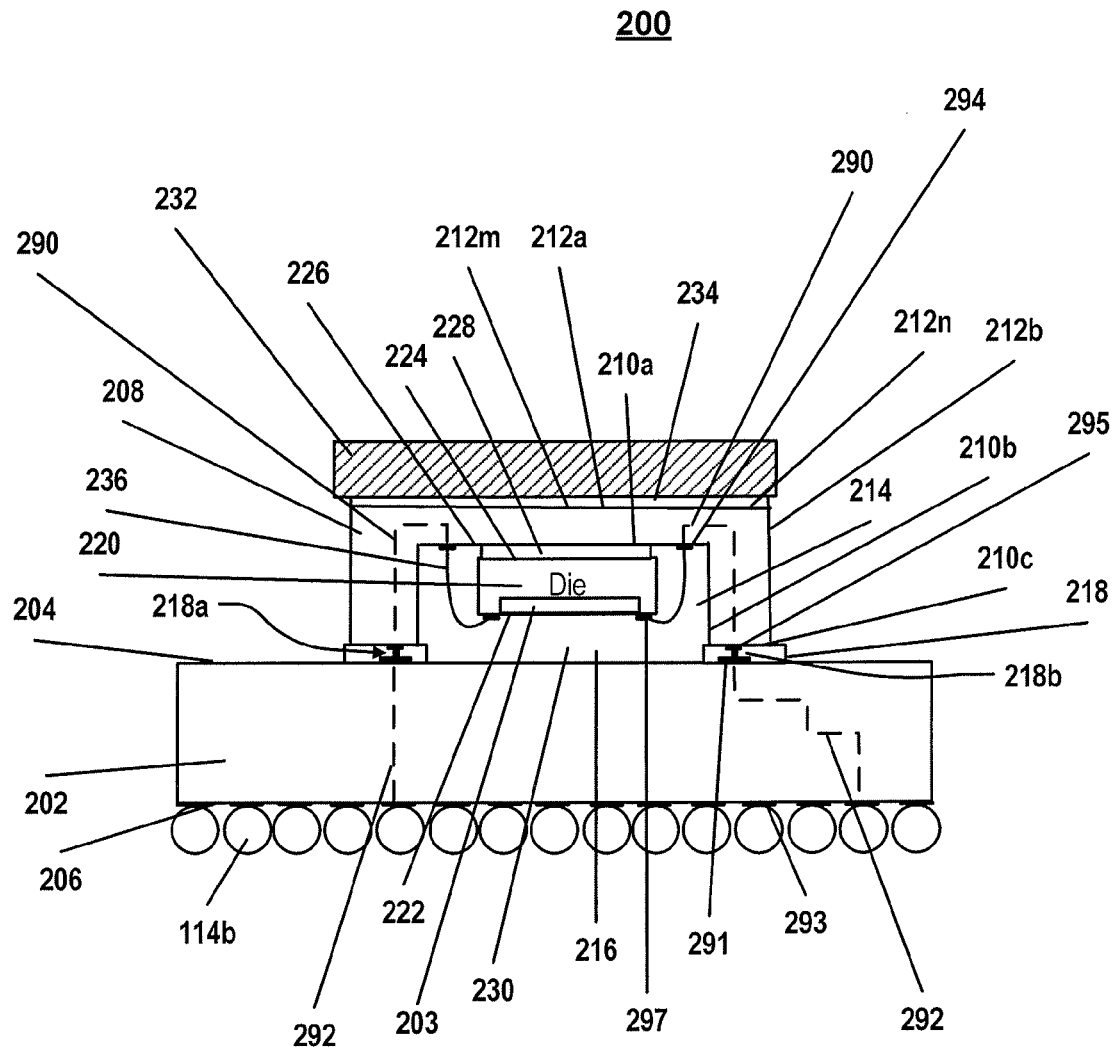
FIG. 2 is a block diagram of an example of a chip-scale package assembly, in accordance with certain configurations of the present disclosure.

FIG. 2 is a block diagram of a chip-scale package assembly, in accordance with certain configurations of the present disclosure. A chip-scale package assembly 200 may comprise a substrate 202 having a top surface 204 and a bottom surface 206. The top surface 204 and the bottom surface 206 may be planar and may be substantially parallel to each other. In certain configurations, the substrate 202 may be positioned so that during operation of the chip-scale package assembly 200, the top surface 204 and the bottom surface 206 are substantially horizontal. A chip-scale frame 208 may be positioned on top of the substrate 202. The top surface 204 of the substrate 202 may include contacts 291 for electrically coupling with the chip-scale frame 208, and the bottom surface 206 may also include contacts 293 for electrically coupling to connectors such as ball grid array connectors 114b. The substrate 202 may include conductive paths such as interconnects 292 between the contacts 291 and the contacts 293.

The chip-scale frame 208 may have a generally box-like, rectangular shape. The chip-scale frame 208 may have an inside surface 210 (including, for example, 210a, 210b and 210c) and an outside surface 212 (including, for example, 212a and 212b). The inside surface 210a, 210b, 210c and the outside surface 212a, 212b may be planar and substantially parallel to each other. For instance, the inside surface 210a is parallel to the outside surface 212a (or the middle portion 212m of the outside surface 212a), the inside surface 210b is parallel to the outside surface 212b, and the inside surface 210c is parallel to the outside surface 212a (or the outer portion 212n of the outside surface 212a). The inside surface 210 of the chip-scale frame may provide a well region 214 with an opening 216. In certain configurations, the opening 216 may be rectangular or square in shape, and the well region 214 may be shaped like a rectangular prism with four walls (not shown) forming four sides of the well region 214. However, other shapes of the opening 216 and the well region 214 (e.g., circular, square, etc.) are possible.

The inside surface 210c may be coupled to the substrate 202 using a coupling mechanism 218 that includes, for example, soldering materials. In one configuration, the inside surface 210c may include electrical contacts 295, and the portion of the substrate 202, which mates with the inside surface 210c, may also include electrical contacts 291. The coupling mechanism 218 may include (i) solder bumps 218a for electrically coupling the electrical contacts 295 on the inside surface 210c to the electrical contacts 291 on the substrate 202 and (ii) an underfill 218b for filling the gaps between the solder bumps. The solder bumps may be used for electrical and/or mechanical coupling, and the underfill may be used for mechanical attachment of the chip-scale frame 208 to the substrate 202. In one aspect, the use of underfill is optional (e.g., not a required element of the attachment method; for example, underfill is not required for a chip-scale packaging (CSP) attachment). Other methods may be utilized to provide electrical and mechanical coupling between the chip-scale frame and the substrate.

Still referring to FIG. 2, a die 220 having a circuit surface 222 and a connecting surface 224 may be housed in the well region 214 by coupling to a wall 226 (e.g., coupling to the bottom surface of the well region 214, as depicted in FIG. 2) of the chip-scale frame 208 using a coupling mechanism 228. The circuit surface 222 and the connecting surface 224 may both be generally planar and parallel to each other. The circuit surface 222 and the connecting surface 224 may be on opposite surfaces of the die 220 and face opposite directions (e.g., the circuit surface 222 facing the substrate 202, and the connecting surface facing a heat sink 232). The circuit surface 222 may comprise microelectronics (electronic circuits) 203 implemented on the die 220. The die 220 may be coupled to any surface of the well region 214, but advantageously may be coupled to the bottom (wall 226) of the well region 214, so that during operation, the circuit surface 222 is in a substantially horizontal position. Such positioning of the circuit surface 222 may advantageously help transfer of heat through the die 220 to the heat sink 232 via the chip-scale frame 208. A heat sink may be made of a metal or a highly thermally conductive material.

The die 220 may be positioned inside the well region 214 leaving a gap 230 between the circuit surface 222 of the die 220 and the top surface 204 of the substrate 202. In certain configurations, the gap 230 may be filled by a sealing material (not shown in FIG. 2). The sealing material may protect microelectronics on the circuit surface 222 as well as be of known electrical characteristics to ensure predictable operation of the microelectronics on the circuit surface 222. In certain configurations, the size of the die 220 may be selected to be smaller than the size of the well bottom (wall 226) to leave sufficient space to allow placement of connectors (e.g., wire bonds) as further described below. In certain configurations, both the die 220 and the wall 226 may be shaped similarly having edges parallel to each other (e.g., both rectangular or both square).

During operation of the illustrated configuration, heat generated by microelectronics on the circuit surface 222 may travel through the chip-scale frame 208 towards the outside surface 212a. A heat sink 232 may be coupled to the outside surface 212a of the chip-scale frame 208 to allow dissipation of heat generated by operation of the integrated circuits on the die 220. In certain configurations, the heat sink 232 may be coupled to the outside surface 212a using an adhesive (e.g., epoxy). In one aspect, it may be advantageous to use a heat-conducting adhesive. For example, an adhesive including one or more metals such as a silver-filled adhesive may be provided to adhere the heat sink 232 to the outside surface 212a and withstand differential thermal expansion between the heat sink 232 and the chip-scale frame 208. In another example, an adhesive including one or more metals such as copper or aluminum may be provided to adhere the heat sink 232 to the outside surface 212a and withstand differential thermal expansion between the heat sink 232 and the chip-scale frame 208. In one aspect, solder bonding may be used to attach the heat sink 232 to the outside surface 212a enabling a higher thermal conductivity than may be achieved by typical adhesives. In certain configurations, during manufacturing of the chip-scale package assembly 200, one or more openings (not shown in the figure) may be provided in the chip-scale frame 208 to allow access from outside. The opening(s) may be used to fill the well region 214 with a non-reacting gas or material, or may be used to create vacuum in the well region 214.

By way of illustration and not limitation, the coupling mechanism 228 may include two mechanisms: (i) a first coupling mechanism for physically securing the die 220 to the chip-scale frame 208 and (ii) a second coupling mechanism for providing electrical coupling between the contacts 297 on the die 220 and the contacts 294 on the chip-scale frame 208.

For the first coupling mechanism, in certain configurations, the die 220 may be secured to the chip-scale frame 208 using an adhesive (e.g., epoxy). In one aspect, it may be advantageous to use a thermally-conductive adhesive (e.g., an adhesive including one or more metals such as copper, aluminum, tin etc.). In one example, the die 220 may be glued directly onto the chip-scale frame 208 using an epoxy adhesive. In another example, solder bonding may be used to attach the die 220 to the chip-scale frame 208. In FIG. 2, the connecting surface 224 is attached to the wall 226. Generally, a surface of the die 220 (e.g., 224 or another surface) may be attached to a surface of the chip-scale frame 208 (e.g., 226 or another surface).

In one configuration, the second coupling mechanism may include wire bonds 236 for coupling the electrical contacts 297 on the circuit surface 222 with the electrical contacts 294 on the wall 226 (e.g., wire-bonding 236). In this configuration, the circuit surface 222 faces the substrate 202.

In one configuration, conductive paths such as interconnects or wiring 290 may be provided in the chip-scale frame 208 between the electrical contacts 294 on the wall 226 and the electrical contacts 295 on the inside surface 210c.

In one aspect, wire bonds are more flexible (e.g., more pliable, bendable, deformable, compliant, resilient, yielding) than solder bumps, and for certain configurations (e.g., for dies that are relative brittle), it may be more advantageous to utilize wire bonds between a die and a chip-scale frame.

Referring to FIG. 2, in operation, electrical signals from the die 220 may travel from the die 220 to the connectors 114b of a chip-scale package assembly via, for example, contacts 297 on the die 220, wire bonds 236, contacts 294 on the wall 226 of the chip-scale frame 208, conductive paths 290, contacts 295 on the inside surface 210c, the coupling mechanism 218 (e.g., solder bumps 218a), contacts 291 on the top surface 204, conductive paths 292, contacts 293 on the bottom surface 206, and ball grid array connectors 114b. Electrical signals from the connectors 114b to the die 220 may travel the same or similar paths in reverse direction.

By way of illustration and not limitation, the die 220 may comprise InP or GaAs semiconductor material. By way of illustration and not limitation, the substrate 202 may comprise layers of high temperature co-fired ceramic (HTCC) material. By way of illustration and not limitation, the chip-scale frame 208 may comprise a material such as a ceramic material, bismaleimide triazine (BT), an organic laminate, HTCC, low temperature co-fired ceramic (LTCC), or another suitable substrate material. In certain configurations, the substrate 202 and the chip-scale frame 208 may both be made of the same material, thereby improving operational performance and durability by having a material with the same coefficient of thermal expansion on both sides of the coupling mechanism 218.

In an alternate configuration, a coupling mechanism between a die and a chip-scale frame may include (i) solder bumps (e.g., controlled collapse chip connectors (C4)) for electrically coupling the electrical contacts of the die to the electrical contacts of the chip-scale frame and (ii) an underfill for filling the gaps between the solder bumps. In this example, a circuit surface of the die (that has the electrical contacts of the die) may face towards, and mate with, a contact surface (e.g., wall 226 in FIG. 2) of the chip-scale frame that has electrical contacts of the chip-scale frame. The circuit surface of the die may be physically attached to the contact surface of the chip-scale frame using the solder bumps and underfill; and the electrical contacts on the circuit surface of the die may be electrically coupled to the electrical contacts of the chip-scale frame using the solder bumps. In this example, a connecting surface of the die may be the same as the circuit surface of the die.

Figure 3:
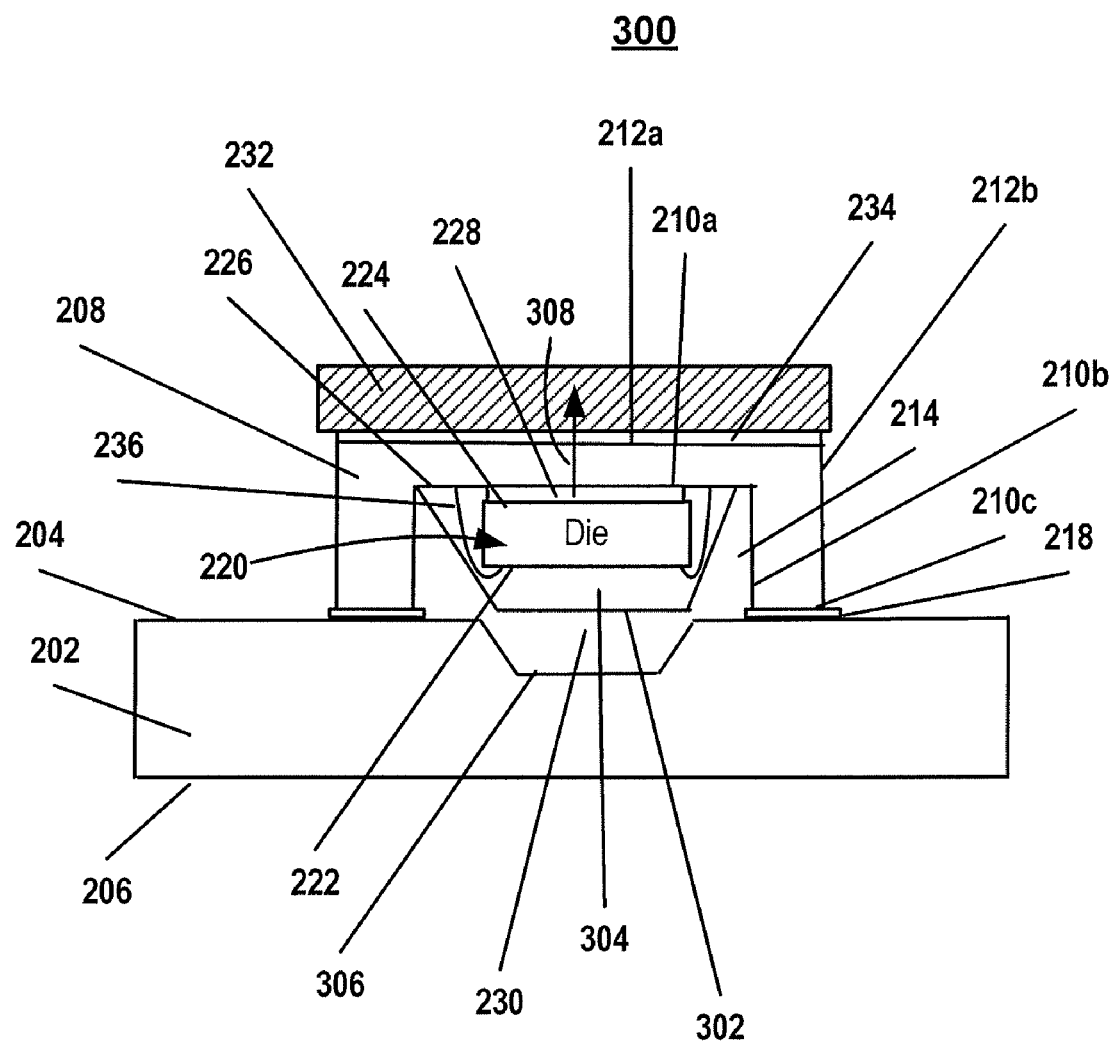
FIG. 3 is a block diagram of an example of a chip-scale package assembly having a substrate with relief, in accordance with certain configurations of the present disclosure.

FIG. 3 is a block diagram of a chip-scale package assembly having a substrate with a relief and a lid, in accordance with certain configurations of the present disclosure. As illustrated, a lid 302 may be attached to the chip-scale frame 208 at the wall 226. The lid 302 may be positioned in the gap 230 in the well region 214 to form an airtight (hermetically sealed) chamber 304 around the die 220. The lid 302 may comprise a surface that is substantially flat and parallel to the circuit surface 222. The lid 302 may comprise, for example, ceramic such as alumina, metal such as Kovar, or liquid crystal polymer (LCP).

Figure 4:
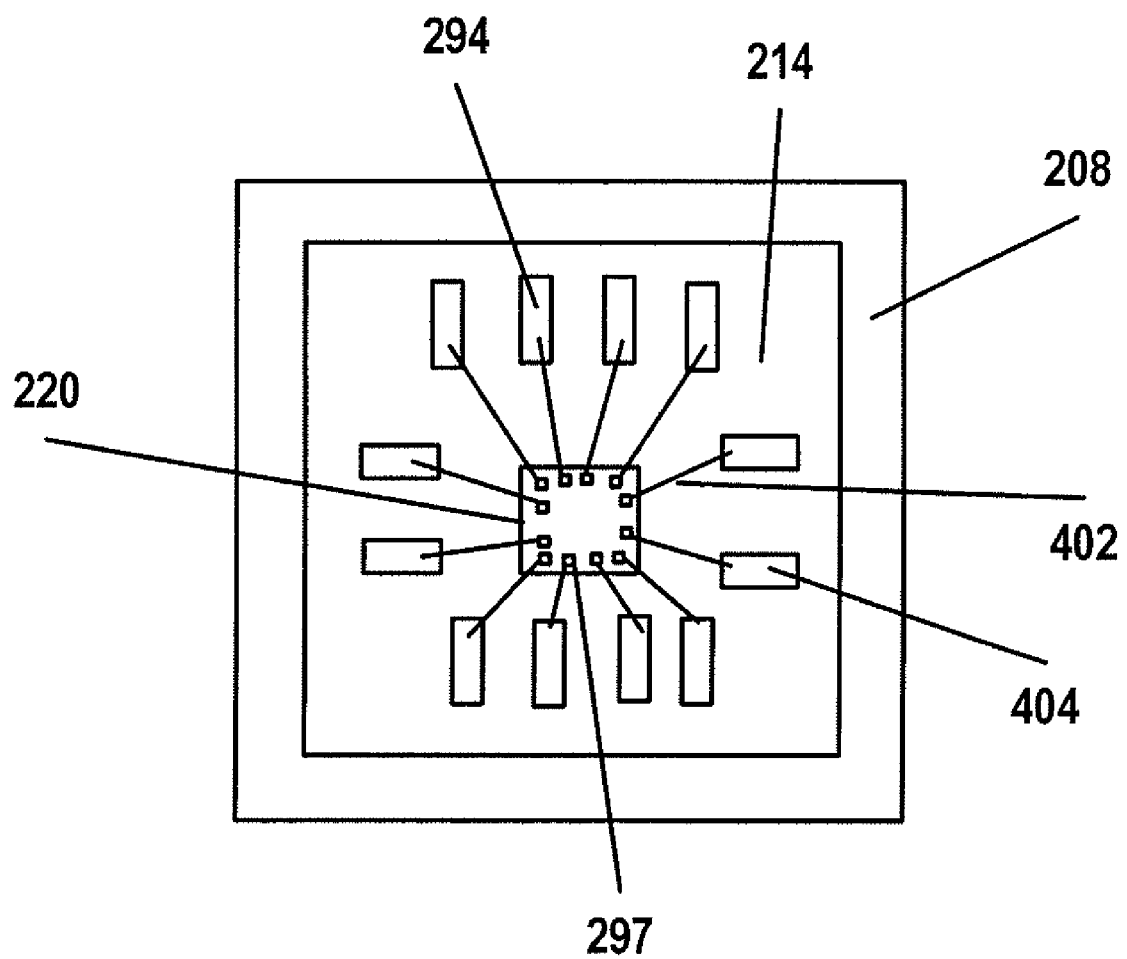
FIG. 4 is a block diagram depicting an example of pin-out of a chip-scale package assembly, in accordance with certain configurations of the present disclosure.

In certain configurations, a relief 306 may be provided in the substrate 202. Note that while FIG. 3 depicts both a relief 306 and a lid 302, these features may be provided independently of each other and be present either alone or together in various configurations. In certain configurations, the relief 306 may be provided to accommodate the lid 302 that would have otherwise been obstructed by the top surface 204 of the substrate 202. During operation, heat produced by the die 220 may be dissipated in the direction 308 by the heat sink 232. In certain configurations, the relief 306 may be fabricated by removing portions of layers of the substrate 202 during the fabrication process. In certain configurations, the relief 306 may be shaped generally similar to the lid 302 and about the same size as the lid 302. FIG. 4 is a block diagram depicting exemplary pin-out of a die of a chip-scale package assembly, as seen from a substrate side, in accordance with certain configurations of the present disclosure. The illustrated configuration shows the contacts 297 of the die 220 in the well region 214 bonded out, using connectors 402 (e.g., wire bonds 236), to a plurality of contacts 294 such as connecting pads 404 on the chip-package frame 208. In certain configurations, the connecting pads 404 may be metal pads. The connecting pads 404 may in turn be electrically coupled to the contacts/connectors (e.g., 291, 293, 114b) on the substrate 202, making them available for connection to external electronics. In certain configurations, because the die 220 may comprise a relatively brittle material such as InP or GaAs, the connectors 402 may be appropriately chosen to minimize mechanical abrasion of/stress on the die 220 during the attachment of the connectors 402 and thermal stress during the operation of the die 220.

It will be appreciated by the practitioners of the art that the chip-scale packaging configurations described with respect to FIGS. 1-4 above may provide several operational advantages. For example, in one aspect, the chip-scale packaging may achieve a "flip-chip" configuration for a die comprising a brittle material such as InP or GaAs, in that, for example, a circuit surface including the circuits or electrical contacts of a die (e.g., 220) may face a substrate (e.g., 202) without having to adhere a die's circuit surface to the substrate (or to a surface of a rigid component). In one aspect, this may allow the use of a known, high yield process to couple the die to a substrate using wire bonding, as needed. Because the die may operate effectively in a "flip-chip" position, the heat generated by the integrated circuits on the die may escape in the upward direction, making it possible to dissipate the heat by placing a heat sink on top of the chip-scale package.

Figure 5:
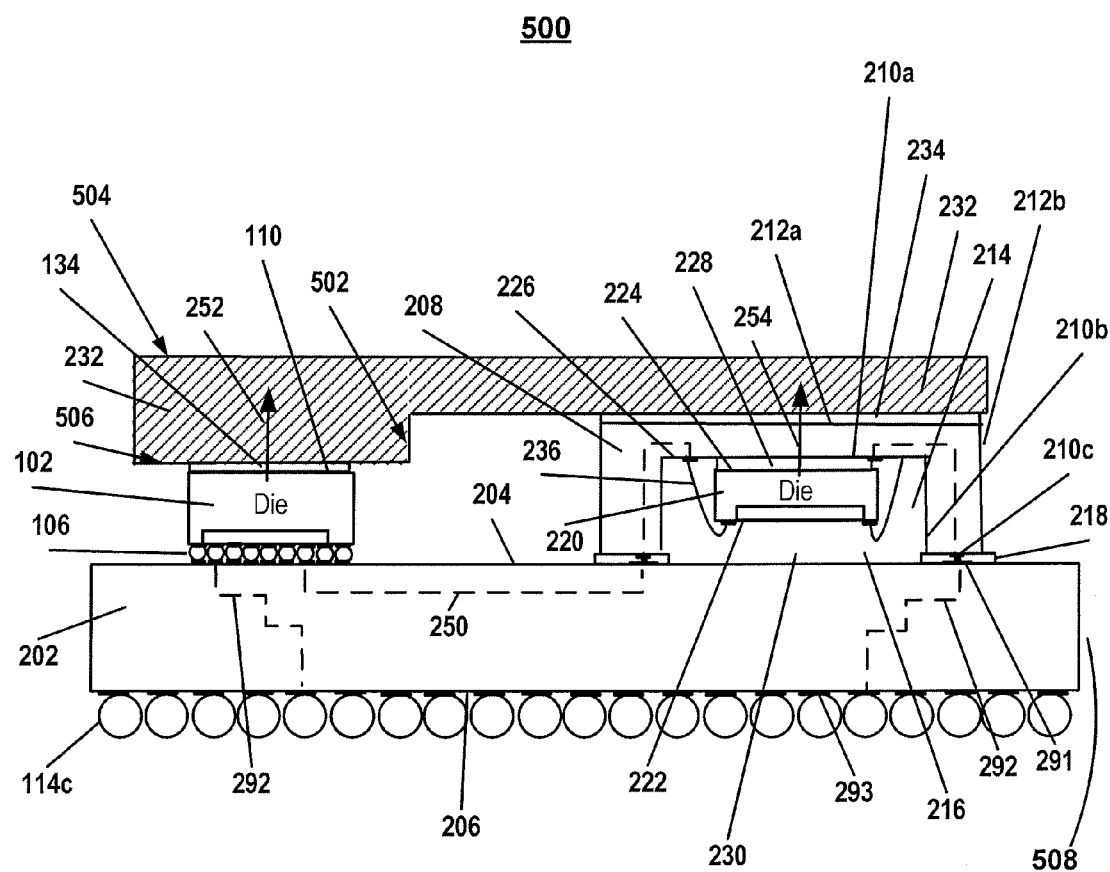
FIG. 5 is a block diagram of an example of a mixed-mode chip assembly having one die in a flip-chip configuration and another die in a chip-scale package, in accordance with certain configurations of the present disclosure.

FIG. 5 is a block diagram of a mixed-mode chip assembly 500 having one die in a flip-chip configuration and another die in a chip-scale package, in accordance with certain configurations of the present disclosure. In certain configurations, a die 102 (in a flip-chip configuration) and die 220 (in a chip-scale package) may be generally rectangular or square in shape and may be placed parallel to, side-by-side, and in proximity of each other. In certain configurations, one or more integrated circuits on die 102 may be coupled to one or more integrated circuits on die 220 (via connectors 250 in the substrate 202 and via connectors in the chip-scale frame 208) to pass electrical signals between the die 102 and the die 220. The connectors 250 may comprise electrical interconnects in the substrate 202. Although the configuration illustrated in FIG. 5 shows two dies, other configurations comprising more than two dies are also possible (e.g., multi-chip modules). In configurations comprising more than two dies in a mixed-mode assembly, one or more dies in a flip-chip configuration and one or more dies in a chip-scale package may be present. Furthermore, connectors 250 may or may not be present between each pair of the dies on such a multi-die configuration.

In operation, the dies 102 and 220 may generate heat that may be transferred in the direction of arrows 252 and 254, respectively. The heat sink 232 may be positioned to simultaneously dissipate heat generated by operation of the dies 102 and 220. The heat sink 232 may generally have a flat plate-like shape with an upper surface 504 facing away from the dies 102 and 220 and a lower surface 506 facing the dies 102 and 220. In the illustrated configuration, the outside surface 212a of the chip-scale frame 208 and the connecting surface 110 of the die 102 are not at the same level, and the lower surface 506 of the heat sink 232 has a step 502 dividing the lower surface 506 in into two substantially planar parts, each part leveled to couple with the respective die (e.g., coupled to the die 102, or coupled to the die 220 via the chip-scale frame 208). Practitioners of art will appreciate that the lower surface 506 may in general comprise multiple levels to take into account different die/package elevations. The multiple levels of the lower surface 506 may be coupled to each other via a joint-shaped-like step (as depicted in FIG. 5), a ramp, a rolling joint, or another suitable joint.

The heat sink 232 may be attached at its lower surface 506 to the outside surface 212a and the connecting surface 110 using an adhesive material that is a good heat conductor to facilitate heat transfer from the dies 102 and 220 to the heat sink 232. In certain configurations, the adhesive material used to adhere the outside surface 212a to the heat sink 232 may be different from the adhesive material used to adhere the connecting surface 110 to the heat sink 232 (e.g., different adhesive materials to match the coefficients of thermal expansion of different materials of the outside surface 212a and the connecting surface 110).

In certain configurations, the bottom surface 206 of the substrate 202 may be coupled to ball grid array connectors 114c to facilitate coupling of the integrated circuits on dies 102 and 220 to outside electronics. In certain configurations, other well-known connection methods may be employed to conduct electrical signals to/from the dies 102, 220 utilizing another surface of the substrate 202 (e.g., vertical surface 508). Such connectors (not shown in FIG. 5) may include, for example, coaxial connectors, GPO or GPPO connectors, solder joints, leadless contacts, or other suitable connectors.

In one example, the die 102 is electrically insulated from the heat sink 232. In another example, the connecting surface 110 of the die 102 is electrically coupled to the heat sink 232, in which case the adhesive layer 134 is electrically conductive. For example, the bulk of the die 102 (which may be referred to as the substrate of the die 102) may be used for ground or power (e.g., Vcc or Vdd), and the connecting surface 110 may couple the ground or power path of the die 102 to the heat sink 232. In one example, a heat sink is thermally conductive. In another example, a heat sink is thermally and electrically conductive. In one example, the substrate 202 is an insulator that includes electrically conductive paths (e.g., contacts, interconnects and connectors). In one example, the chip-scale frame 208 is an insulator that includes electrically conductive paths (e.g., contacts, interconnects and connectors).

In one example, two dies in a chip assembly are made of the same material (e.g., silicon) but from two different processes, and only one of the dies supports a flip-chip bumping process.

Figure 6:
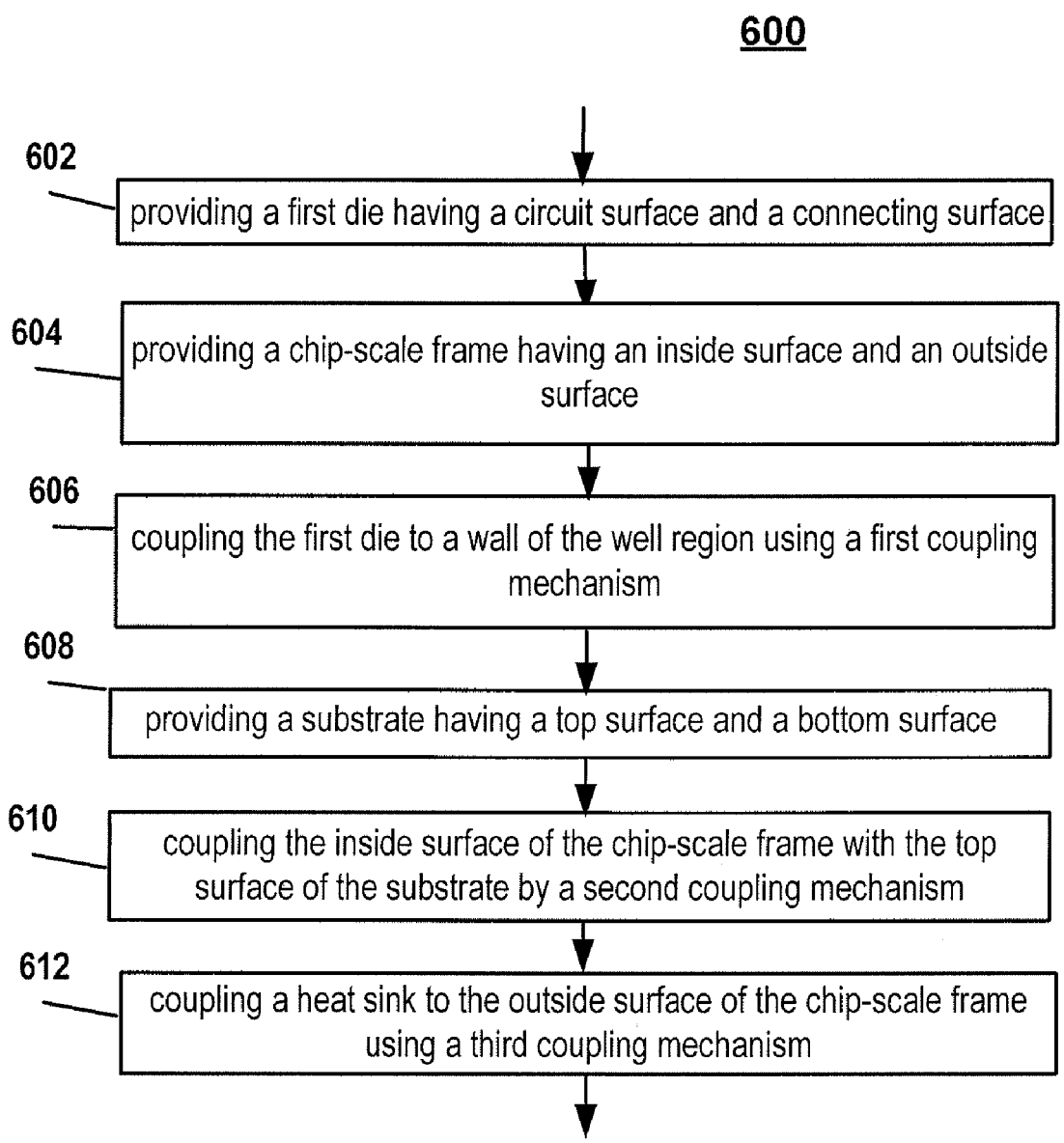
FIG. 6 is a flow chart illustrating exemplary operations of a process of packaging a semiconductor die, in accordance with certain configurations of the present disclosure.

FIG. 6 is a flow chart of an exemplary process for creating a semiconductor package, in accordance with certain configurations of the present disclosure. At operation 602, a first die (e.g., 220 in FIG. 2 or 3) having a circuit surface and a connecting surface may be provided. The circuit surface may comprise integrated circuits, and the connecting surface may be configured for adhesion to another surface. In one example, a circuit surface is different from a connecting surface. In another example, a circuit surface may be on the same surface as a connecting surface. The first die may comprise, for example, a semiconductor material such as silicon germanium (SiGe), indium phosphide (InP) or gallium arsenide (GaAs).

At operation 604, a chip-scale frame (e.g., 208), having an inside surface and an outside surface, may be provided. The chip-scale frame may have a well region having an opening within the inside surface. The chip-scale frame may comprise a material such as HTCC, LTCC, a ceramic material, bismaleimide triazine (BT), or an organic laminate.

Still referring to FIG. 6, at operation 606, the first die may be coupled to a wall of the well region using a coupling mechanism. The coupling mechanism may comprise, for example, attaching the first die to the wall. The coupling mechanism may further include coupling the electrical contacts on the circuit surface with contacts on the chip-scale frame. The first die may be positioned to have a gap between the circuit surface and a substrate (e.g., 202). At operation 608, a substrate may be provided for mounting the first die and the chip-scale frame. The substrate may have a top surface and a bottom surface. The substrate may be made of a material such as HTCC.

At operation 610, an inside surface of the chip-scale frame may be coupled with the top surface of the substrate by a coupling mechanism. This coupling mechanism may include, for example, soldering materials. At operation 612, a heat sink (e.g., 232) may be coupled to an outside surface of the chip-scale frame using a coupling mechanism. This coupling mechanism may include, for example, an adhesive material that is a good conductor of heat to facilitate heat transfer from the first die to the heat sink. In an alternative process, operation 612 may be performed prior to operation 608 or 610.

Returning to operation 606, a lid (e.g., 302) may be attached to the chip-scale frame, the lid being positioned in a gap between a circuit surface of the first die and the top surface of the substrate, the lid forming a substantially airtight chamber around the first die. The airtight chamber may be filled with a non-reacting gas such an inert gas (e.g., xenon), to protect the integrated circuits on the die from exposure to vapors from epoxy material and/or other soldering material used in the chip assembly and from other gaseous emissions from the substrate or other components of a chip-scale package assembly. During manufacturing, the operation of attaching the lid may be performed prior to operation 608 or prior to coupling the chip-scale package assembly (including 208 and 220) to the substrate in operation 610. It should be noted that some of the operations described with respect to FIG. 6 may be performed in different order or performed simultaneously.

Figure 7:
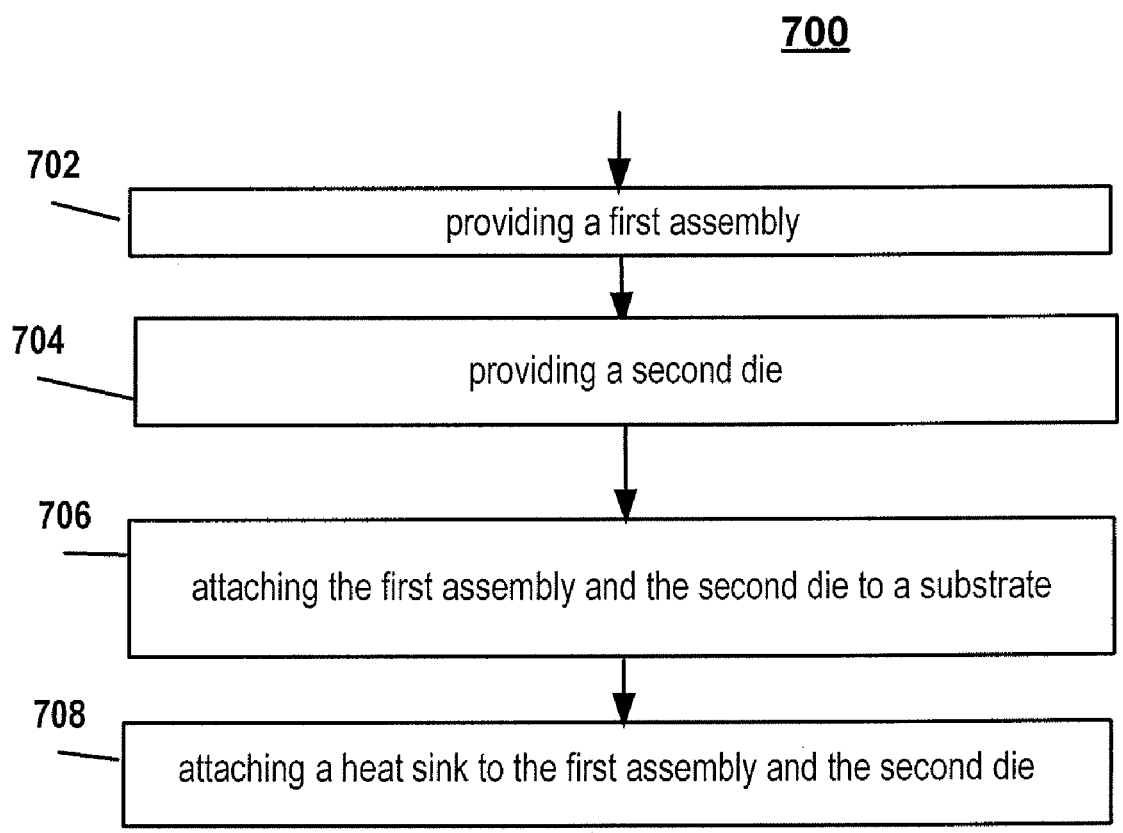
FIG. 7 is a flow chart illustrating exemplary operations of a process of packaging multiple semiconductor dies, in accordance with certain configurations of the present disclosure.

In certain configurations, the process of mixed-mode packaging may include attaching at least two dies to a substrate (see, e.g., FIG. 5). Referring to FIGS. 5 and 7, at operation 702, a first assembly including a first die attached to a chip-scale frame (with or without a lid) may be provided. At operation 704, a second die may be provided. At operation 706, the first assembly and the second die may be attached to a substrate using a coupling mechanism, including both electrical and mechanical coupling. For example, solder bumps (e.g., 218a) on the first assembly and solder bumps (e.g., 106b) on the second die may be electrically connected to the contacts on the substrate, and an underfill material may be provided between the first assembly and the substrate and between the second die and the substrate. In one example, the first assembly and the second die are attached to the substrate simultaneously in one step. In another example, either the first assembly or the second die is attached to the substrate first, and then the other one is attached to the substrate subsequently. At operation 708, a heat sink (e.g., 232) is attached to the first assembly and the second die. It should be noted that some of the operations described with respect to FIG. 7 may be performed in different order or performed simultaneously. In one aspect, the term solder bumps may be referred to as solder joints or solder balls.

Still referring to FIGS. 5 and 7, the second die may be attached to the substrate in a flip-chip configuration. The second die may be electrically coupled to external connectors (e.g., 114c) of the substrate via interconnects (e.g., 292), electrically coupled to the first die via interconnects (e.g., 250) embedded in the substrate, and mechanically attached to the heat sink. The second die may comprise, for example, SiGe material. The connectors or interconnects (e.g., 250) may be shielded to minimize radiative interference with each other and/or electronic circuitry on the first die and the second die. A plurality of connectors, such as ball grid array (BGA) connectors (e.g., 114c), may be attached to the bottom surface of the substrate (e.g., 202) to facilitate connection to external circuits. In certain configurations, the connectors may be attached to another surface (e.g., on a side of the substrate 202 other than the top surface 204 or the bottom surface 206 of the substrate) and may be of another well-known type (e.g., GPPO connectors). The lower surface (e.g., 506) of the heat sink (e.g., 232) may be suitably leveled to achieve close thermal coupling of the heat sink and the first assembly and close thermal coupling of the heat sink and the second die.

It will be appreciated by practitioners of the art that the mixed-mode packaging described above may also be used to package multiple dies of the same type (or different type in some examples) on a substrate. For example, more than one chip-scale package may be packaged together and placed on one substrate in a multi-chip module. In some configurations, each chip-scale package may include a chip-scale frame, one or more dies, and optionally a heat sink. In some configurations, the chip-scale packages may be connected by connectors embedded in a substrate. In one aspect, such mixed-mode packaging may provide operational advantages such as being able to use an inexpensive process to mount a die on a substrate, being able to isolate integrated circuits on a circuit surface from exposure to emissions from chemicals in the package and electromagnetic interference from other circuits or connectors, being able to use the entire bottom surface of the substrate for placing ball grid arrays, and being able to share, among multiple dies, a common heat sink advantageously placed in the direction of heat dissipation.

In certain aspects, a package including one or more semiconductor dies may be hermetically sealed. For example, each of the dies may be hermetically sealed individually and separately, or multiple dies may be hermetically sealed together. These dies may be mounted on the same substrate and share the same heat sink. This provides an inexpensive manufacturing process over traditional methods.

The subject technology is illustrated, for example, according to various aspects described below. Numbered clauses are provided below for convenience. These are provided as examples, and do not limit the subject technology.

1. A chip assembly comprising:
   a substrate having a top surface and a bottom surface;
   a first die having a circuit surface and a connecting surface, the circuit surface comprising one or more integrated circuits;
   a chip-scale frame having an inside surface, an outside surface, and a well region, the well region having an opening within the inside surface, the well region having a wall, the well region housing the first die, the first die attached to the wall by a first coupling mechanism, the inside surface coupled to the top surface of the substrate by a second coupling mechanism; and
   a heat sink coupled to the outside surface of the chip-scale frame using a third coupling mechanism.

2. The chip assembly of clause 1, further comprising:
   a second die having a second circuit surface and a second connecting surface, the second circuit surface comprising one or more integrated circuits, contacts on the second circuit surface coupled to contacts on the top surface of the substrate for electrical communication, a circuit on the second die coupled to a circuit on the first die for electrical communication via connectors embedded in the substrate and via connectors embedded in the chip-scale frame, the second connecting surface attached to the heat sink for at least thermal conduction, the second die disposed between the heat sink and the substrate,
   wherein the first die and the chip-scale frame are disposed laterally adjacent to the second die, the first die is disposed between the chip-scale frame and the substrate, the chip-scale frame is disposed between the heat sink and the substrate, the circuit surface faces toward the substrate, the connecting surface faces toward the heat sink, contacts on the circuit surface are coupled to contacts on the wall using wire bonds, and the connecting surface is attached to the wall using an adhesive, wherein the second coupling mechanism comprises solder joints for electrical communication, and the third coupling mechanism comprises an adhesive that is at least thermally conductive.

3. The chip assembly of clause 2, wherein the second die is attached to the substrate using controlled collapse chip connectors (C4), the substrate comprises ball grid array connectors on the bottom surface, and the adhesive for the third coupling mechanism is electrically conductive.

4. The chip assembly of clause 2, wherein the first die is made of a first material and the second die is made of a second material different from the first material, and wherein the first die is more brittle than the second die.

5. The chip assembly of clause 1, further comprising:
   a second die in a flip-chip configuration attached to the substrate and coupled to the first die for electrical communication via connectors embedded in the substrate, the second die further coupled to the heat sink.

6. The chip assembly of clause 5, wherein the first die comprises indium phosphide (InP) or gallium arsenide (GaAs), and the second die comprises silicon germanium (SiGe).

7. The chip assembly of clause 1, further comprising:
   a lid attached to the chip-scale frame, the lid being positioned in a gap between the circuit surface of the first die and the top surface of the substrate, the lid forming a substantially airtight chamber around the first die.

8. The chip assembly of clause 7, wherein the airtight chamber comprises a non-reacting gas.

9. The chip assembly of clause 1, wherein the substrate comprises a relief on the top surface adjacent to the well region.

10. The chip assembly of clause 1, wherein the substrate comprises high temperature co-fired ceramic (HTCC), and wherein the chip-scale frame comprises HTCC, a ceramic material, bismaleimide triazine (BT), or an organic laminate.

11. The chip assembly of clause 1, wherein the first die comprises indium phosphide (InP) or gallium arsenide (GaAs).

12. The chip assembly of clause 1, wherein the first coupling mechanism comprises wire bonds between the circuit surface and the wall, and the first coupling mechanism comprises an adhesive between the connecting surface and the wall.

13. The chip assembly of clause 1, wherein the second coupling mechanism comprises solder joints for communication of a plurality of signals, and wherein the circuit surface is different from the connecting surface.

The subject technology is illustrated, for example, according to various aspects described below. Numbered clauses are provided below for convenience. These are provided as examples, and do not limit the subject technology.

1. A method of packaging one or more semiconductor dies, the method comprising:
   providing a first die having a circuit surface and a connecting surface;
   providing a chip-scale frame having an inside surface and an outside surface, the chip-scale frame having a well region having an opening in the inside surface;
   coupling the first die to a wall of the well region using a first coupling mechanism for electrical and mechanical coupling;
   providing a substrate having a top surface and a bottom surface;
   coupling the inside surface of the chip-scale frame with the top surface of the substrate by a second coupling mechanism, wherein a gap is provided between the circuit surface of the first die and the top surface of the substrate; and coupling a heat sink to the outside surface of the chip-scale frame using a third coupling mechanism.

2. The method of clause 1, further comprising:

providing a second die having a second circuit surface and a second connecting surface, the second circuit surface comprising one or more integrated circuits;

coupling contacts on the second circuit surface to contacts on the top surface of the substrate for electrical communication;

coupling the second connecting surface to the heat sink for at least thermal conduction, the second die disposed between the heat sink and the substrate, wherein the first die and the chip-scale frame are disposed laterally adjacent to the second die, the first die is disposed between the chip-scale frame and the substrate, the chip-scale frame is disposed between the heat sink and the substrate, the circuit surface faces toward the substrate, the connecting surface faces toward the heat sink, contacts on the circuit surface are coupled to contacts on the wall using wire bonds, and the connecting surface is attached to the wall using an adhesive, wherein the second coupling mechanism comprises solder joints for electrical communication, the third coupling mechanism comprises an adhesive that is at least thermally conductive, and a circuit on the second die is coupled to a circuit on the first die for electrical communication via connectors embedded in the substrate and via connectors embedded in the chip-scale frame.

3. The method of clause 2, wherein the first die is made of a first material and the second die is made of a second material different from the first material, and wherein the first die is more brittle than the second die.

4. The method of clause 1, further comprising:

attaching a second die in a flip-chip configuration to the substrate, wherein the second die is coupled to the first die for electrical communication via connectors embedded in the substrate and via connectors embedded in the chip-scale frame; and coupling the second die to the heat sink.

5. The method of clause 4, wherein the attaching of the second die to the substrate occurs prior to the coupling of the heat sink to the outside surface of the chip-scale frame.

6. The method of clause 4, wherein the first die comprises indium phosphide (InP) or gallium arsenide (GaAs), and the second die comprises silicon germanium (SiGe).

7. The method of clause 4, wherein the operation of attaching the second die to the substrate comprises attaching the second die to the substrate using controlled collapse chip connectors (C4), the substrate comprises ball grid array connectors on the bottom surface, and an adhesive for the third coupling mechanism is electrically conductive.

8. The method of clause 1, further comprising:

attaching a lid to the chip-scale frame, the lid being positioned in a gap between the circuit surface of the first die and the top surface of the substrate, the lid forming a substantially airtight chamber around the first die.

9. The method of clause 8, wherein the airtight chamber comprises a non-reacting gas.

10. The method of clause 1, wherein the substrate comprises a relief on the top surface adjacent to the well.

11. The method of clause 1, wherein the substrate comprises high temperature co-fired ceramic (HTCC) and the chip-scale frame comprises HTCC or a ceramic material or bismaleimide triazine (BT) or an organic laminate.

12. The method of clause 1, wherein the first die comprises indium phosphide (InP) or gallium arsenide (GaAs).

13. The method of clause 1, wherein the first coupling mechanism comprises wire bonds between the circuit surface and the wall, and the first coupling mechanism comprises an adhesive between the connecting surface and the wall.

14. The method of clause 1, wherein the second coupling mechanism comprises solder joints.

The subject technology has been described with particular illustrative configurations. It is to be understood that the subject technology is not limited to the above-described configurations and that various changes and modifications may be made by those of ordinary skill in the art without departing from the scope if the subject technology.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more."

In one aspect, the term "connected," "coupled" or the like may refer to being directly connected or coupled. In another aspect, the term "connected," "coupled" or the like may refer to being indirectly connected or coupled.

In one example, an integrated circuit may refer to a circuit comprising at least one transistor. In another example, an integrated circuit may refer to a circuit comprising a plurality of transistors. In yet another example, an integrated circuit may refer to a circuit comprising more than a hundred transistors. In one example, an integrated circuit may refer to a circuit comprising one or more bipolar junction transistors, one or more field effect transistors, and/or one or more other components. In one example, a circuit may include one or more of a passive component (e.g., a resistor, a capacitor) and/or an active component (e.g., a transistor).

In one example, a chip-scale package may be a package that includes a die. In one example, a chip-scale package may include one or more dies, attached to a substrate and wire-bonded. In one example, a chip-scale package may include a die attached to a substrate using an epoxy material and wire bonds, and may further include a lid covering the die and hermetically sealing the die. In one example, a chip-scale package may comprise a substrate made of a dielectric material and a chip bonded to the substrate and electrically coupled to the substrate using a well-known method such as wire-bonding.

In one aspect, wire bonds are not limited to traditional wire bonds (e.g., ball bonds and wedge bonds). In one example, wire bonds may refer to flexible connectors. In one example, wire bonds may refer to connectors that are flexible enough so that they do not break away during the manufacturing of a package (e.g., while the die is being attached to its substrate or to its chip-scale frame). In another example, wire bonds may refer to connectors that are sufficiently flexible so that they do not break away during the normal operation of the package subjected to temperature variance.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method of packaging one or more semiconductor dies, the method comprising:
   providing a first die having a circuit surface and a connecting surface;
   providing a chip-scale frame having an inside surface and an outside surface, the chip-scale frame having a well region having an opening in the inside surface;
   coupling the first die to a wall of the well region using a first coupling mechanism for electrical and mechanical coupling;
   providing a substrate having a top surface and a bottom surface;
   coupling the inside surface of the chip-scale frame with the top surface of the substrate by a second coupling mechanism, wherein a gap is provided between the circuit surface of the first die and the top surface of the substrate;
   coupling a heat sink to the outside surface of the chip-scale frame using a third coupling mechanism;
   attaching a second die in a flip-chip configuration to the substrate, wherein the second die is coupled to the first die for electrical communication via connectors embedded in the substrate and via connectors embedded in the chip-scale frame; and
   coupling the second die to the heat sink.

2. The method of claim 1, wherein the first die comprises indium phosphide (InP) or gallium arsenide (GaAs), and the second die comprises silicon germanium (SiGe).

3. The method of claim 1, wherein the first die is made of a first material and the second die is made of a second material different from the first material, and wherein the first die is more brittle than the second die.

4. The method of claim 1, wherein the substrate comprises a relief on the top surface adjacent to the well.

5. The method of claim 1, wherein the substrate comprises high temperature co-fired ceramic (HTCC) and the chip-scale frame comprises HTCC or a ceramic material or bismaleimide triazine (BT) or an organic laminate.

6. The method of claim 1, wherein the attaching of the second die to the substrate occurs prior to the coupling of the heat sink to the outside surface of the chip-scale frame.

7. The method of claim 1, wherein the operation of attaching the second die to the substrate comprises attaching the second die to the substrate using controlled collapse chip connectors (C4), the substrate comprises ball grid array connectors on the bottom surface, and an adhesive for the third coupling mechanism is electrically conductive.

8. The method of claim 1, wherein the first coupling mechanism comprises wire bonds between the circuit surface and the wall, and the first coupling mechanism comprises an adhesive between the connecting surface and the wall.

9. The method of claim 1, wherein the second coupling mechanism comprises solder joints.

10. A method of packaging one or more semiconductor dies, the method comprising:
    providing a first die having a circuit surface and a connecting surface;
    providing a chip-scale frame having an inside surface and an outside surface, the chip-scale frame having a well region having an opening in the inside surface;
    coupling the first die to a wall of the well region using a first coupling mechanism for electrical and mechanical coupling;
    providing a substrate having a top surface and a bottom surface;
    coupling the inside surface of the chip-scale frame with the top surface of the substrate by a second coupling mechanism, wherein a gap is provided between the circuit surface of the first die and the top surface of the substrate;
    coupling a heat sink to the outside surface of the chip-scale frame using a third coupling mechanism;
    providing a second die having a second circuit surface and a second connecting surface, the second circuit surface comprising one or more integrated circuits;
    coupling contacts on the second circuit surface to contacts on the top surface of the substrate for electrical communication; and
    coupling the second connecting surface to the heat sink for at least thermal conduction, the second die disposed between the heat sink and the substrate,
    wherein the first die and the chip-scale frame are disposed laterally adjacent to the second die, the first die is disposed between the chip-scale frame and the substrate, the chip-scale frame is disposed between the heat sink and the substrate, the circuit surface faces toward the substrate, the connecting surface faces toward the heat sink, contacts on the circuit surface are coupled to contacts on the wall using wire bonds, and the connecting surface is attached to the wall using an adhesive,
    wherein the second coupling mechanism comprises solder joints for electrical communication, the third coupling mechanism comprises an adhesive that is at least thermally conductive, and a circuit on the second die is coupled to a circuit on the first die for electrical communication via connectors embedded in the substrate and via connectors embedded in the chip-scale frame.

11. The method of claim 10, wherein the first die is made of a first material and the second die is made of a second material different from the first material, and wherein the first die is more brittle than the second die.

12. The method of claim 10, wherein the substrate comprises a relief on the top surface adjacent to the well.

13. The method of claim 10, wherein the substrate comprises high temperature co-fired ceramic (HTCC) and the chip-scale frame comprises HTCC or a ceramic material or bismaleimide triazine (BT) or an organic laminate.

14. The method of claim 10, wherein the first coupling mechanism comprises wire bonds between the circuit surface and the wall, and the first coupling mechanism comprises an adhesive between the connecting surface and the wall.

* * * * *